United States Patent
Daily et al.

(10) Patent No.: US 7,704,082 B2
(45) Date of Patent: Apr. 27, 2010

(54) THROUGH BOARD INVERTED CONNECTOR

(75) Inventors: Christopher G. Daily, Harrisburg, PA (US); Matthew Mostoller, Hummelstown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/144,241

(22) Filed: Jun. 23, 2008

(65) Prior Publication Data

US 2009/0317989 A1 Dec. 24, 2009

(51) Int. Cl.
*H01R 12/00* (2006.01)
(52) U.S. Cl. ...................................... 439/83
(58) Field of Classification Search ............. 439/78–83
See application file for complete search history.

(56) References Cited

U.S. PATENT DOCUMENTS

| | | | |
|---|---|---|---|
| 5,197,891 | A | 3/1993 | Tanigawa et al. |
| 6,089,902 | A | 7/2000 | Daoud |
| 6,190,210 | B1 | 2/2001 | Belopolsky et al. |
| 6,287,130 | B1 * | 9/2001 | Torii ..................... 439/83 |
| 6,558,205 | B1 | 5/2003 | Shi et al. |
| 6,733,319 | B1 | 5/2004 | Jørgensen |
| 6,848,950 | B2 | 2/2005 | Allison et al. |
| 6,848,953 | B2 | 2/2005 | Schell et al. |
| 7,220,141 | B2 | 5/2007 | Daily et al. |
| 7,258,562 | B2 | 8/2007 | Daily et al. |
| 7,261,579 | B2 | 8/2007 | Ku et al. |
| 7,374,436 | B2 | 5/2008 | Schell et al. |
| 7,402,064 | B2 | 7/2008 | Daily et al. |
| 7,452,249 | B2 | 11/2008 | Daily et al. |
| 7,458,839 | B2 | 12/2008 | Ngo et al. |
| 7,470,160 | B1 | 12/2008 | Mostoller et al. |
| 7,513,793 | B2 | 4/2009 | Horst et al. |
| 7,540,761 | B2 | 6/2009 | Weber et al. |
| 7,547,214 | B2 | 6/2009 | Duesterhoeft et al. |
| 2002/0098743 | A1 | 7/2002 | Schell et al. |
| 2003/0181106 | A1 | 9/2003 | Schell et al. |
| 2005/0136713 | A1 | 6/2005 | Schell et al. |
| 2005/0181643 | A1 | 8/2005 | Brower et al. |
| 2006/0003620 | A1 | 1/2006 | Daily et al. |
| 2006/0189194 | A1 | 8/2006 | Daily et al. |
| 2006/0228927 | A1 | 10/2006 | Daily et al. |
| 2006/0258123 | A1 | 11/2006 | Forbes |
| 2006/0258213 | A1 | 11/2006 | Ku et al. |
| 2006/0281354 | A1 | 12/2006 | Ngo et al. |
| 2007/0202748 | A1 | 8/2007 | Daily et al. |
| 2008/0153344 | A1 | 6/2008 | Horst et al. |

* cited by examiner

*Primary Examiner*—Briggitte R Hammond

(57) ABSTRACT

A connector assembly is configured to be mounted to a substrate that has an opening extending between a mounting side and an opposite side. The connector assembly includes a housing and one or more contacts. The housing has a front end and a back end, with an interior chamber extending inward from a mating interface. The front end of the housing is configured to be partially inserted through the opening in the substrate until a housing mounting surface engages the mounting side of the substrate. The contact extends between a mating end and a contact mounting surface. The contact mounting surface is configured to be mounted to the mounting side of the substrate. The housing and contact mounting surfaces are substantially coplanar in a mourning plane, and a distance between the mating interface and the mounting plane is at least as great as a thickness of the substrate.

20 Claims, 5 Drawing Sheets

THROUGH BOARD INVERTED CONNECTOR

BACKGROUND OF THE INVENTION

The subject matter herein relates generally to electrical connectors, and more particularly, to surface mounted electrical connectors.

Many known connectors are mounted on a top side of a circuit board and protrude upward from the circuit board. These connectors include electrical contacts that are electrically connected to conductive traces in the circuit board or to wires that extend along the surface and/or sides of the circuit board. The connectors have a mating interface configured to mate with a mating connector. The mating interface typically is located parallel or perpendicular with respect to the top side of the circuit board.

These known connectors may have a height profile above the top side of the circuit board that is too large for certain applications. For example, the profile of many connectors used in conjunction with light emitting diodes ("LEDs") may be so large relative to the LEDs that the connectors impede or block some of the light emitted by the LEDs. Additionally, the trend toward smaller electronic devices and more densely packed electronic devices and connectors on a circuit board requires the reduction of the height profile for connectors.

A need exists for a connector having a smaller profile than known connectors. Such a connector may be useful in devices where a smaller connector height profile is desired, such as in LED lighting devices.

BRIEF DESCRIPTION OF THE INVENTION

In one embodiment, a connector assembly is provided. The connector assembly is configured to be mounted to a substrate that has an opening extending between a mounting side and an opposite side. The connector assembly includes a housing and one or more contacts. The housing has a front end and a back end, with an interior chamber extending inward from a mating interface defined at the front end. The interior chamber is configured to mate with a mating connector. The front end of the housing is configured to be partially inserted through the opening in the substrate until a housing mounting surface engages the mounting side of the substrate. The contact extends between a mating end and a contact mounting surface. The mating end is disposed within the interior chamber and is configured to engage a mating contact of the mating connector. The contact mounting surface is configured to be mounted to the mounting side of the substrate. The housing and contact mounting surfaces are substantially coplanar in a mounting plane, and a distance between the mating interface and the mounting plane is at least as great as a thickness of the substrate.

In one embodiment, another connector assembly is provided. The connector assembly is configured to be mounted to a substrate that has an opening extending between a mounting side and an opposite side. The connector assembly includes a housing and one or more contacts. The housing has a front end, a back end and an interior chamber extending inward from a mating interface. The mating interface is configured to mate with a mating connector. The housing includes a contact opening through the back end to the interior chamber. The housing is configured to be partially inserted through the opening in the substrate and mounted to the mounting side of the substrate at a housing mounting surface. The contact extends between a mating end and a contact mounting surface. The contact is loaded into the contact opening such that the mating end is provided within the interior chamber. The contact extends from the back end to a side of the housing, with the contact mounting surface extending outward from the side of the housing and configured to be mounted to the mounting side of the substrate.

In one embodiment, another connector assembly is provided. The connector assembly is configured to be mounted to a substrate that has an opening extending between a mounting side and an opposite side. The connector assembly includes a housing, a tab and one or more contacts. The housing extends between front and back ends with an interior chamber extending from the front end toward the back end. The housing is configured to be loaded into the opening such that the front end of the housing extends from the opposite side of the substrate and the back end of the housing extends from the mounting side of the substrate. The bracket is coupled to the housing and includes a housing mounting surface. The contact extends between a mating end and a contact mounting surface, with the mating end disposed in the interior chamber. The contact extends from the back end of the housing to the contact mounting surface. The housing and contact mounting surfaces are configured to be mounted to the mounting side of the substrate.

DETAILED DESCRIPTION OF THE INVENTION

Figure 1:
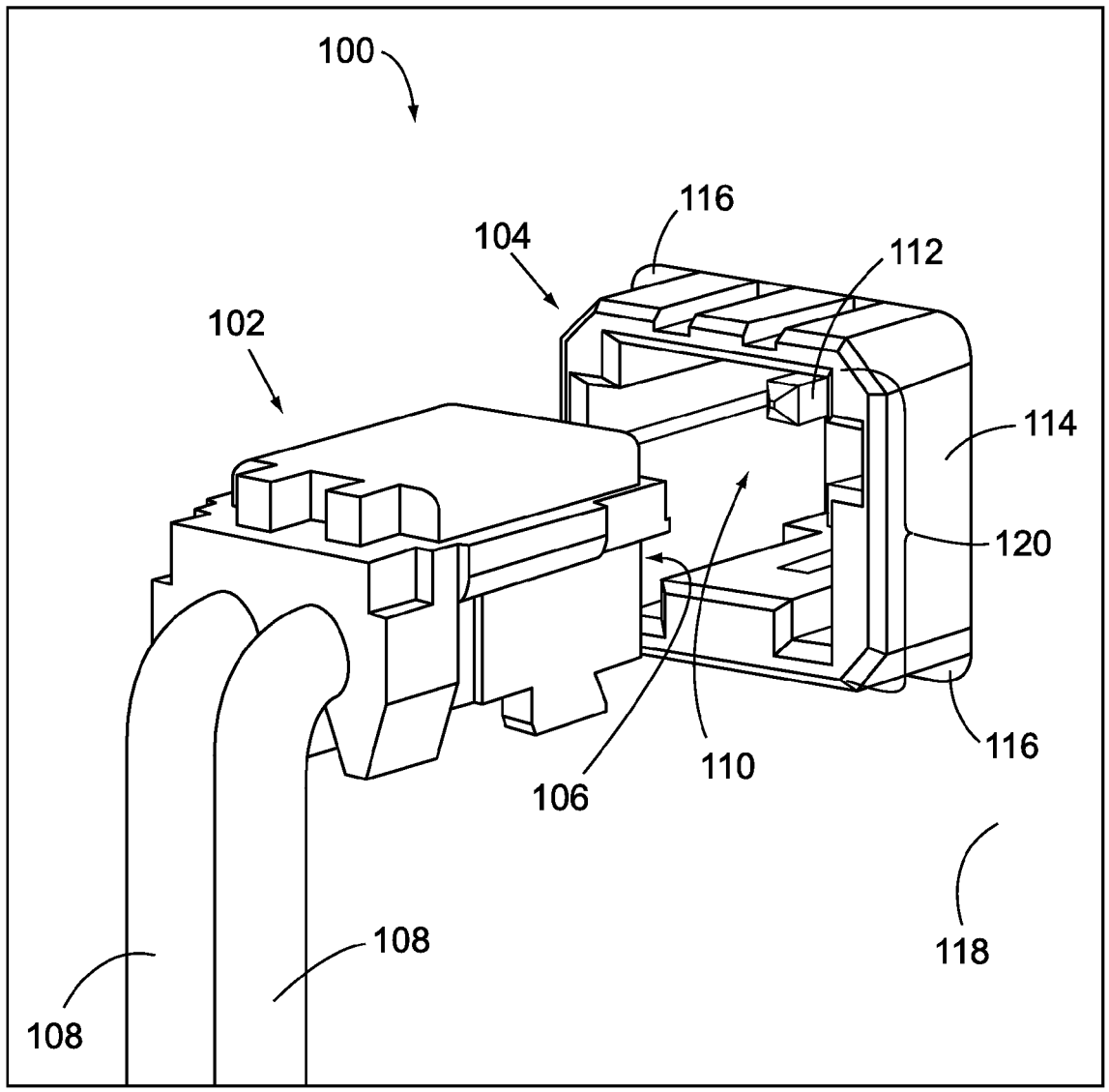
FIG. 1 is a front perspective view of a connector system in accordance with one embodiment.

FIG. 1 is a front perspective view of a connector system 100 in accordance with one embodiment. The connector system 100 includes a mating connector 102 and a connector assembly 104. The mating connector 102 is shaped to be inserted into, and thus mate with, the connector assembly 104 in the illustrated embodiment. In another embodiment, the mating connector 102 may be shaped to receive the connector assembly 104. The mating connector 102 includes a plug end 106 that holds at least one mating contact (not shown). In the illustrated embodiment, the mating connector 102 is cable mounted to a plurality of cables 108 with internal conductors (not shown) that are terminated to the mating contacts in the plug end 106. In an alternative embodiment, the mating connector 102 may be board mounted rather than cable mounted.

The connector assembly 104 includes a housing 114 that partially protrudes through an opening 116 in a substrate 118 in the illustrated embodiment. The substrate 118 is a substantially flat supporting layer that may mechanically support and electrically connect the connector assembly 104 with one or more peripheral devices (not shown) using one or more conductive traces 310 (shown in FIG. 3). For example, the substrate 118 may include a metal clad printed circuit board ("PCB") or an FR4 PCB. Other embodiments of the substrate 118 also may be used in one or more embodiments described herein. In one embodiment, the housing 114 includes and/or is formed from a dielectric material, such as a plastic material. An interior chamber 110 is located in the housing 114 and is shaped to receive the plug end 106 in the illustrated embodiment. The interior chamber 110 extends from a mating interface 120 of the housing 114 inward toward a back end 218 (shown in FIG. 2) of the housing 114. For example, the mating interface 120 may be the front loading side of the housing 114 through which the plug end 106 is loaded. In another embodiment, the mating interface 120 is received by the mating connector 102. In the illustrated embodiment, the housing 114 at least partially protrudes through the opening 116 such that the mating interface 120 is located proximate to and past the substrate 118. In another embodiment, the mating interface 120 is substantially flush with the substrate 118. In another embodiment, the mating interface 120 is partially recessed in the opening 116. A plurality of contacts 112 are provided in the interior chamber 110. The contacts 112 engage the contacts (not shown) in the plug end 106 when the plug end 106 is inserted into the interior chamber 110. The contacts 112 engage the contacts in the plug end 106 to provide an electrical connection between the mating connector 102 and the connector assembly 104. While one embodiment of the connector assembly 104 is shown in FIG. 1, other types of connectors may be used in accordance with various embodiments described herein.

Figure 2:
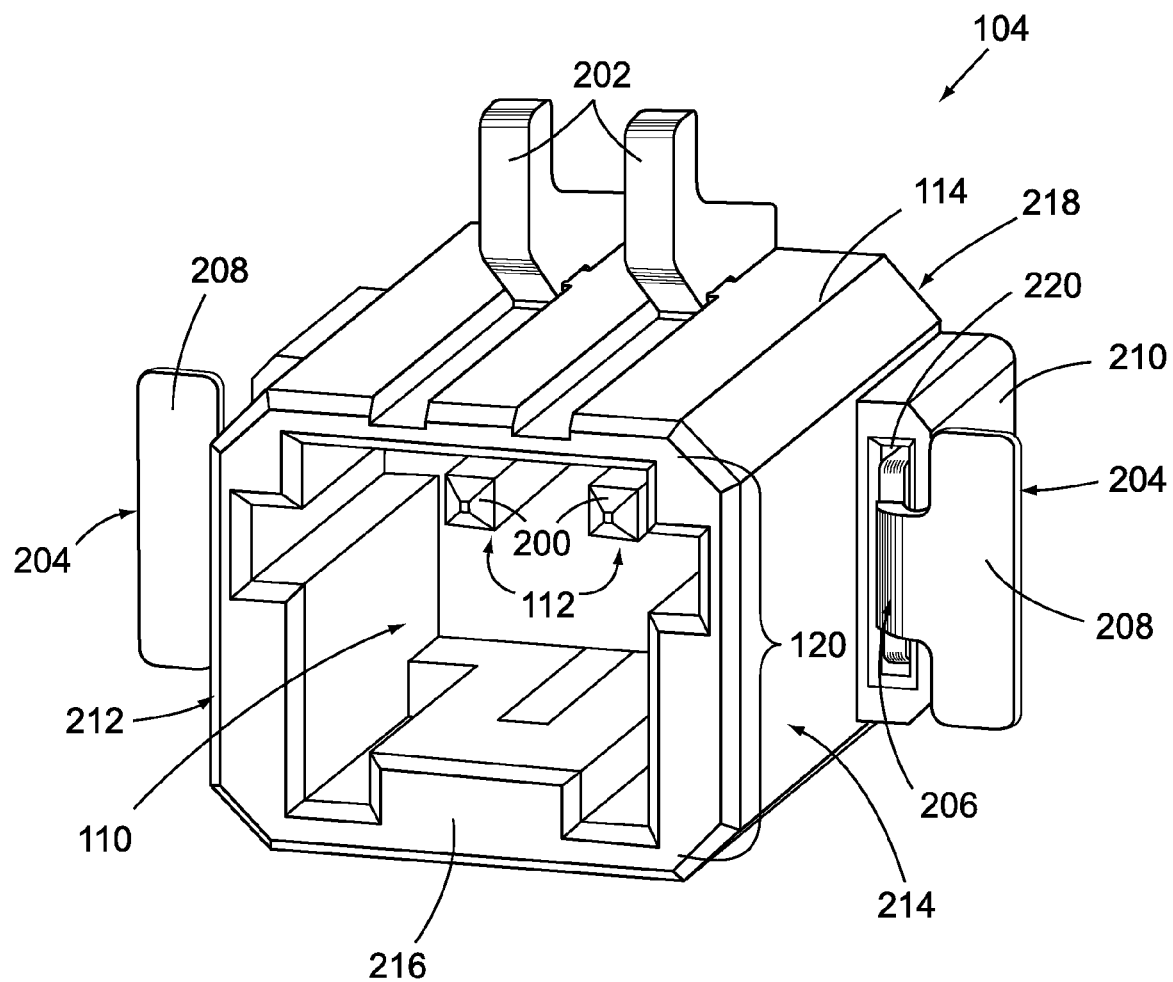
FIG. 2 is a front perspective view of a connector assembly shown in FIG. 1.

FIG. 2 is a front perspective view of the connector assembly 104. As shown in FIG. 2, the housing 114 extends between front and back ends 216, 218, with the mating interface 120 located at the front end 216. Each of the contacts 112 in the connector assembly 104 extends between a mating interface end 200 and a mounting surface 202. While two contacts 112 are shown in the illustrated embodiment, a different number of contacts 112 may be provided. In one embodiment, the mating interface ends 200 are located within the interior chamber 110 of the housing 114 and the mounting surfaces 202 are located external to the interior chamber 110.

A plurality of protrusions 210 extends from opposite sides 212, 214 of the housing 114 and extends from the back end 218 (shown in FIG. 2) of the housing 114 partially toward the mating interface 120 in one embodiment. The protrusions 210 may define a depth of insertion of the housing 114 into the opening 116. For example, the protrusions 210 may limit how far the housing 114 may be inserted into the opening 116. In one embodiment, each of a plurality of tabs 204 extends from one of the protrusions 210. The tabs 204 may be used to mount the connector assembly 104 to the substrate 118 (shown in FIG. 1). For example, the tabs 204 may be soldered or otherwise affixed to the substrate 118 to secure the connector assembly 104 on the substrate 118 and to add additional security to the substrate 118.

Each of the tabs 204 may be formed of a material that is stamped and formed so as to have a bend 206 and a mounting surface 208. For example, the tabs 204 may be stamped and formed from a conductive material such as a metal. Each of the tabs 204 may be connected to the housing 114 by inserting an insertion portion 514 (shown in FIG. 5) of the tabs 204 into corresponding slots 220 of the housing 114, as shown in illustrated embodiment. The slots 220 may be provided within the protrusions 210. The tabs 204 may each include one or more retention barbs 516 (shown in FIG. 5) that are inserted into the slot 220 to secure the tab 204 in the slot 220. The bend 206 is an approximately 90 degree bend in the illustrated embodiment. In another embodiment, the bend 206 is an angle other than 90 degrees. The mounting surfaces 208 may be substantially parallel to the mating interface 120 in one embodiment. In the illustrated embodiment, the mounting surfaces 208 of the tabs 204 and the mounting surfaces 202 of the contacts 112 are substantially coplanar.

Figure 5:
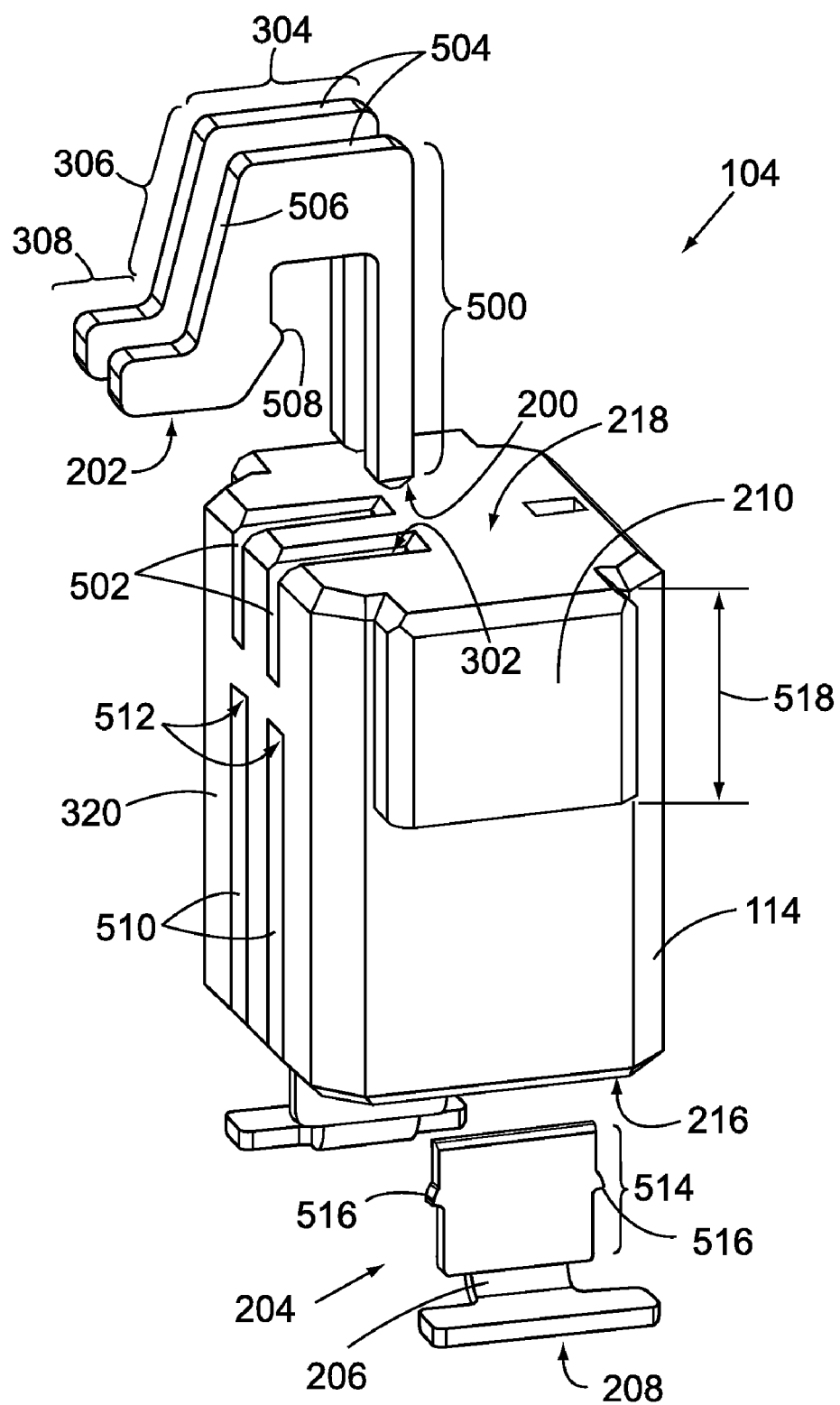
FIG. 5 is an exploded view of the connector assembly shown in FIG. 1.

FIG. 5 is an exploded view of the connector assembly 104. In the illustrated embodiment, each of the contacts 112 includes an insertion portion 500, a flat portion 304, an angled portion 306 and a mounting portion 308. In one or more other embodiments of the contacts 112, the contacts 112 extend between the mating interface end 200 in the interior chamber 110 (shown in FIG. 1) and the mounting surface 202 outside of the interior chamber 110. For example, the contacts 112 may not include one or more of the insertion, flat, angled and mounting portions 500, 304, 306, 308, and/or may be shaped differently that the contacts 112 shown in FIG. 5. The contacts 112 shown in FIG. 5 are merely provided as an example of one embodiment.

In the illustrated embodiment, the insertion portion 500 includes a part of the contact 112 that is inserted into the interior chamber 110 through an opening 302 in the back end 218 of the housing 114. The insertion portion 500 may extend between the mating interface end 200 and the flat portion 304. The flat portion 304 is received into an upper slot 502 in the back end 218 in the illustrated embodiment. The upper slot 502 may extend along the back end 218 and partially down a side 320 of the housing 114. The flat portion 304 may be received into the upper slot 502 so that a top surface 504 of the flat portion 304 is flush with the back end 218. The flat portion 304 extends between the insertion portion 500 and the angled portion 306. The angled portion 306 includes an angled surface 506 that extends between the mounting portion 308 and the flat portion 304 and along a side 320 of the housing 114. The angled portion 306 may include a retention barb 508 on a side of the angled portion 306 that opposes the angled surface 506. The retention barb 508 may be inserted into a bottom slot 510 in the side 320 in the housing 218. The bottom slot 510 may partially extend from the front end 216 of the housing 218 toward the back end 218. The bottom slot 510 may end at a ledge 512 that provides an engagement surface for the retention barb 508. For example, the contact 112 may be loaded into the bottom slot 510 and the top slot 502 so that the that the retention barb 508 engages the ledge 512. The engagement between the retention barb 508 and the ledge 512 may prevent the contact 112 from being removed from the housing 114. The angled portion 306 extends between the flat portion 304 and the mounting portion 308. The mounting portion 308 extends partially away from the angled portion 306. The mounting portion 308 includes the mounting surfaces 202.

As shown in FIG. 5, the tabs 204 include the insertion portion 514 that is connected to the mounting surface 208, with a bend 206 between the insertion portion 514 and the mounting surface 208. The insertion portion 514 in the illustrated embodiment includes the retention barbs 516 on opposite sides of the insertion portion 514. The retention barbs 516 may engage the inside of the slot 220 (shown in FIG. 2) when the insertion portion 514 is inserted into the slot 220 in order to prevent the tab 204 from being removed from the slot 220. In another embodiment, the tabs 204 are secured in the slots 220 through a press fit connection.

Figure 3:
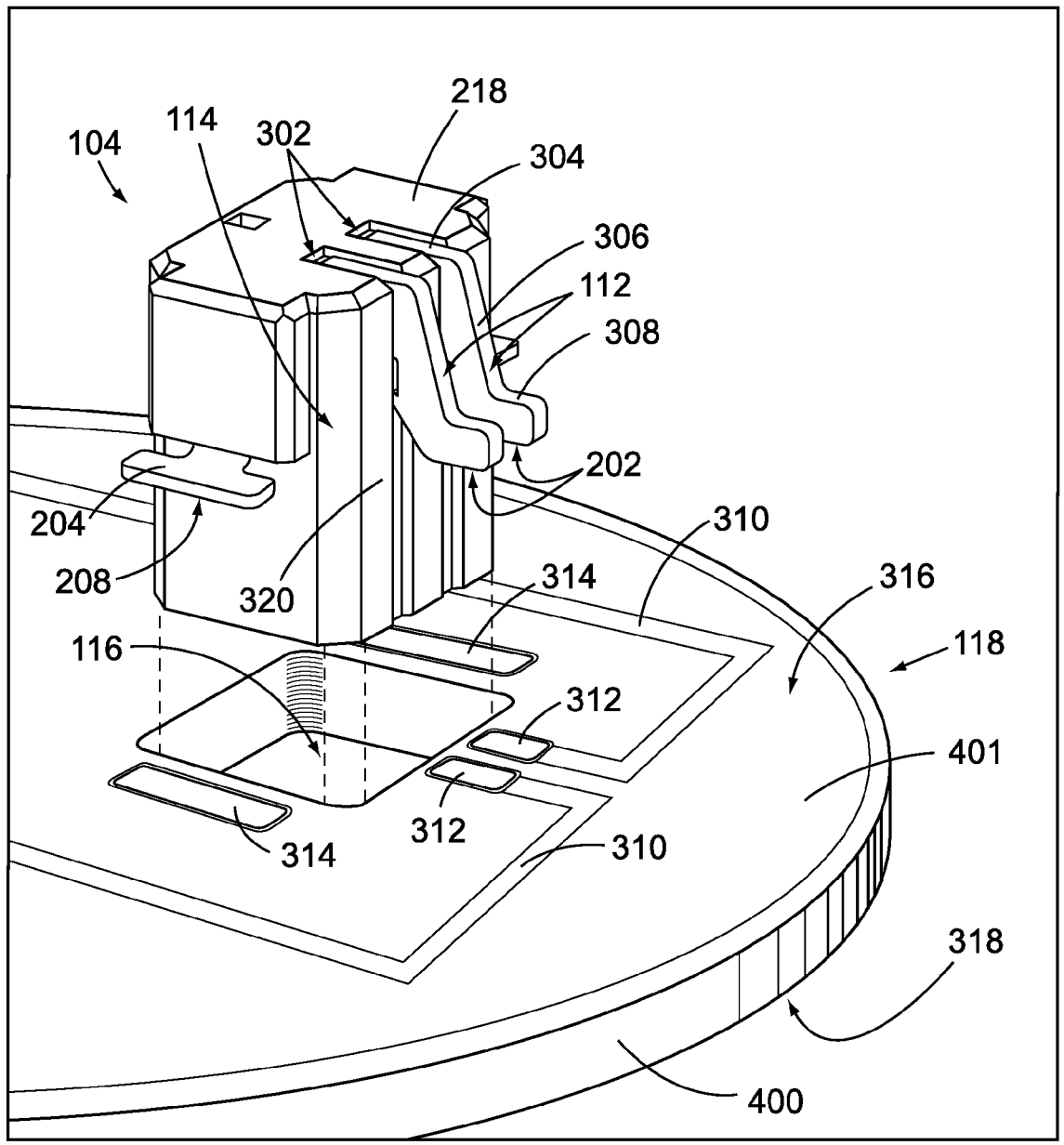
FIG. 3 is a perspective view of the connector assembly shown in FIG. 1 prior to inserting the connector assembly into an opening in a substrate shown in FIG. 1 and prior to mounting the connector assembly to the substrate.

FIG. 3 is a perspective view of the connector assembly 104 prior to inserting the connector assembly 104 into the opening 116 in the substrate 118 and prior to mounting the connector assembly 104 to the substrate 118. As shown in FIG. 3, the substrate 118 may include a plurality of contact pads 312 that are electrically connected to the conductive traces 310. The contact pads 312 may include and/or be formed from conductive material that is electrically connected to the conductive traces 310. In another embodiment, the contact pads 312 may be portions of the conductive traces 310 that are exposed. In one embodiment, the substrate 118 is a PCB that includes a plurality of layers (not shown) of dielectric material with conductive traces (such as the conductive traces 310) provided in one or more of the layers. In one embodiment, the substrate 118 is a PCB with conductive traces 310 on a mounting side 316 and an opposite side 318 of the substrate 118. In another embodiment, the substrate 118 is a PCB with conductive traces 310 in locations of the substrate 118 that are proximate to the contact pads 312 that are only on the mounting side 316 of the substrate 118. As described above, the substrate 118 may include a metal clad board in one embodiment. For example, the substrate 118 may include a layer 400 of conductive material that is partially enclosed with a layer 400 of nonconductive material. In one embodiment, the substrate 118 is a metal clad board used in lighting devices having one or more LEDs mounted on the mounting side 316 of the substrate 118.

The substrate 118 may include a plurality of mounting pads 314. The mounting pads 314 may include or be formed of a material that can be used to secure the mounting surfaces 208 of the tabs 204 to the substrate 118, as described above. For example, the mounting pads 314 may define solder pads and the mounting surfaces 208 may be soldered to the mounting pads 314.

During assembly, the connector assembly 104 may be physically and electrically connected to the substrate 118 by partially inserting the housing 114 into the opening 116, connecting the mounting surfaces 202 of the contacts 112 to the contact pads 312, and securing the mounting surfaces 208 of the tabs 204 to the mounting pads 314. For example, the connector assembly 104 may be physically connected to the substrate 118 by securing the mounting surfaces 208 of the tabs 204 to the mounting pads 314. By way of example only, the mounting surfaces 208 of the tabs 204 may be secured to the mounting pads 314 by soldering the mounting surfaces 208 and the mounting pads 314 together. As another example, the mounting surfaces 208 may be soldered using hand or surface mount solder methods. As another example, the mounting surfaces 208 may be affixed to the mounting pads 314 using an adhesive material. For example, the mounting surfaces 208 may be secured to the mounting pads 314 using an epoxy such as a conductive epoxy. The connector assembly 104 may be electrically connected to the substrate 118 by electrically connecting the mounting surfaces 202 of the contacts 112 to the contact pads 312. For example, the mounting surfaces 202 and the contact pads 312 may be soldered together. In one embodiment, the connector assembly 104 is mounted to the substrate 118 on only one side of the substrate 118. For example, the mounting surfaces 202 of the contacts 112 may be connected to the contact pads 312 and the mounting surfaces 208 of the tabs 204 may be secured to the mounting pads 314, with no other mechanical coupling between the connector assembly 104 and substrate 118 being provided.

Figure 4:
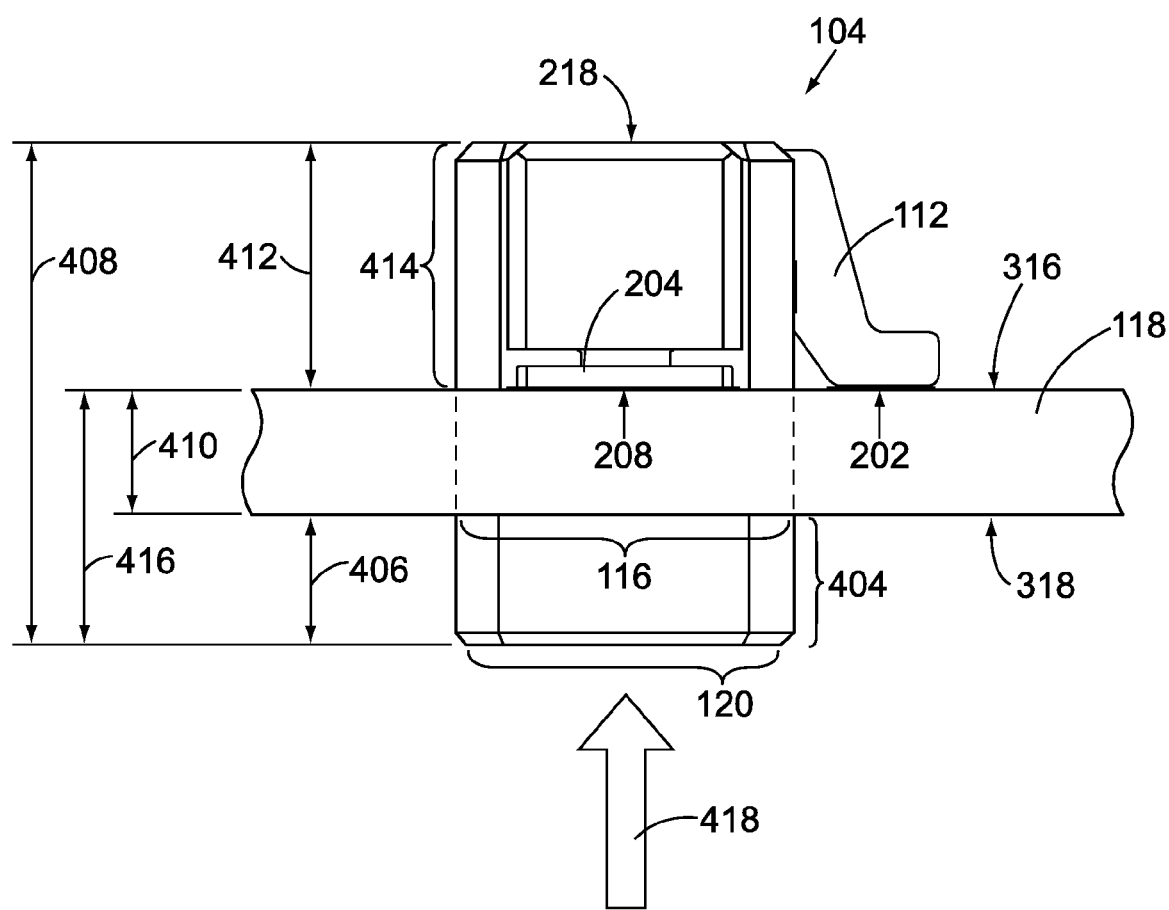
FIG. 4 is a plan view of the connector assembly shown in FIG. 1 mounted to the substrate shown in FIG. 1.

FIG. 4 is a plan view of the connector assembly 104 mounted to the substrate 118. The opening 116 extends between the mounting and opposite sides 316, 318 of the substrate 118. A protruding portion 404 of the housing 114 protrudes through the opening 116 (shown in FIG. 1) in the substrate 118 past the opposite side 318 of the substrate 118. The protruding portion 404 extends between the mating interface 120 and the opposite side 318 when the connector assembly 104 is mounted to the substrate 118. The protruding portion 404 may have a height 406 between the mating interface 120 and the opposite side 318 that represents the distance that the mating interface 120 protrudes through the opening 116. In one embodiment, the height 406 is the distance between the mating interface 120 and the opposite side 318 in a direction that is substantially perpendicular to the mating interface 120 and the opposite side 318. The height 406 may be varied by changing a total height 408 of the connector assembly 104, a thickness 410 of the substrate 118, a height 412 of a mounting side portion 414 of the connector assembly 104, adjusting a height 518 (shown in FIG. 5) of the protrusions 210 (shown in FIG. 2) of the housing 114, and/or adjusting how far the insertion portions 514 (shown in FIG. 5) of the tabs 204 are inserted into the slots 220 (shown in FIG. 2). The height 518 of the protrusions 210 is the distance the protrusions 210 extend away from the back end 218.

The mounting side portion 414 of the connector assembly 104 is the portion of the connector assembly 104 that extends between the mounting side 316 of the substrate 118 and the back end 218 of the housing 114. The height 412 of the mounting side portion 414 is the distance between the back end 218 and the mounting side 316 in a direction that is substantially perpendicular to the back end 218 and the mounting side 316 in one embodiment.

The height 412 of the mounting side portion 414 may be sufficiently small so that the connector assembly 104 defines a low profile connector. For example, the height 412 may be sufficiently small such that an LED positioned proximate to the connector assembly 104 on the mounting side 316 is capable of emitting light beyond the connector assembly 104 without the mounting side portion 414 or the mating connector 102 blocking the light. For example, the height 412 may be sufficiently small such that the back end 218 is located proximate to the mounting side 316 of the substrate 118.

As described above, the mounting surfaces 202, 208 of the contacts 112 and the tabs 204 may be substantially coplanar with one another. The plane in which the mounting surfaces 202, 208 are coplanar with respect to one another may be referred to as a mounting plane. In one embodiment, the mounting plane is coplanar with the mounting side 316. In the embodiment illustrated in FIG. 4, the mounting side 316 also may represent the mounting plane. In another embodiment, the mounting plane may be disposed at an angle with respect to the mounting side 316. For example, the housing 114 (shown in FIG. 1) may be connected to the tabs 204 and the contacts 112 so that the housing 114 is disposed at an angle that is transverse to the mounting side 316 while the mounting surfaces 202, 208 of the contacts 112 and the tabs 204 are substantially coplanar with the mounting side 316. The mating interface 120 may be substantially parallel to the mounting plane. For example, the mating interface 120 may be substantially parallel to the opposite side 318 of the substrate 118 such that the plug end 106 (shown in FIG. 1) of the mating connector 102 (shown in FIG. 1) mates with the connector assembly 104 by moving the plug end 106 relative to the connector assembly 104 along a loading direction 418. The loading direction 418 may be substantially perpendicular to the substrate 118, including the opposite side 318 of the substrate 118. In another embodiment, the mating interface 120 may be disposed at an angle that is transverse to the mounting plane. As described above, the housing 114 may be connected to the tabs 204 and the contacts 112 so that the housing 114 and the mating interface 120 are angled with respect to the mounting side 316 while the mounting surfaces 202, 208 of the contacts 112 and the tabs 204 are substantially coplanar with the mounting side 316.

In the illustrated embodiment, a distance 416 between the mounting plane and the mating interface 120 is greater than the height 406 of the protruding portion 404 so that the mating interface 120 is provided past the opposite side 318. Although not shown in FIG. 4, in another embodiment the mating interface 120 may be recessed within the opening 116. For example, the distance 416 may be less than the thickness 410 of the substrate 118 so that the mating interface 120 is located between the mounting and opposite sides 316, 318 of the substrate 118. The distance 416 is substantially perpendicular to the mating interface 120 in one embodiment. In embodiments where the distance 416 is greater than the height 406, the mating interface 120 protrudes past the opposite side 318. In another embodiment, the distance 416 between the mounting plane and the mating interface 120 is approximately the same as the thickness 410 of the substrate 118. In such an embodiment, the mating interface 120 may be substantially flush with the opposite side 318.

Various embodiments described herein provide for a low profile connector assembly that does not extend a considerable height above one side of a substrate to which the connector is mounted. Reducing the height above which the connector extends above at least one side of the substrate can be beneficial in applications where low profile connectors are necessary. For example, in many lighting devices comprising a substrate, one or more LEDs and a connector configured to receive power for the LEDs, the connector must have a sufficiently low profile such that the connector and a corresponding mating connector do not interfere with the light emitted by the LEDs.

Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly for mounting to a substrate having an opening extending between a mounting side and an opposite side, the connector assembly comprising:
    a housing having a front end, an opposite back end, and a side extending from the front end to the back end, the housing having an interior chamber extending inward from the front end, the housing comprising a contact opening extending through the back end to the interior chamber and a contact slot extending from the contact opening to the side of the housing along the back end; and
    a contact extending between a mating end disposed in the interior chamber and a contact mounting surface disposed outside of the housing, the contact loaded into the contact opening and extending through the contact slot in the back end of the housing to the side of the housing and to the contact mounting surface, wherein the contact mounting surface is mounted to the mounting side of the substrate such that the front end of the housing protrudes through the opening in the substrate.

2. The connector assembly of claim 1, wherein the front end is disposed at an angle with respect to the mounting surface of the substrate.

3. The connector assembly of claim 1, wherein the housing includes a tab slot inwardly extending into the housing, further comprising a tab inserted into the tab slot and extending from the tab slot toward the front end of the housing to a mounting surface that is mounted to the mounting side of the substrate.

4. The connector assembly of claim 1, wherein the contact is at least partially disposed within the contact slot of the housing and is flush with the back end of the housing.

5. The connector assembly of claim 1, wherein the side of the housing includes an internal ledge, further wherein the contact includes a retention barb that secures the contact to the internal ledge of the housing.

6. The connector assembly of claim 1, wherein the front end of the housing is recessed within the opening in the substrate between the sides of the substrate when the housing is mounted to the substrate.

7. The connector assembly of claim 1, wherein the housing includes a protrusion outwardly extending from the side of the housing and from the back end partially toward the front end, the protrusion including a tab slot, further comprising a tab received in the tab slot and extending from the tab slot to a mounting surface that is secured to the mounting side of the substrate.

8. The connector assembly of claim 7, wherein the tab includes a bend disposed between the protrusion of the housing and the mounting surface.

9. A connector assembly for mounting to a substrate having an opening extending between a mounting side and an opposite side, the connector assembly comprising:
    a housing extending between front and back ends with an interior chamber extending from the front end toward the back end, the housing including a side that extends from the front end to the back end and a protrusion outwardly extending from the side, the protrusion having an inwardly extending tab slot, the housing configured to be loaded into the opening such that the front end of the housing protrudes past the opposite side of the substrate and the back end of the housing extends from the mounting side of the substrate;
    a tab received in the tab slot of the protrusion and coupled to the housing, the tab extending from the tab slot toward the front end of the housing to a housing mounting surface; and
    a contact extending between a mating end and a contact mounting surface, the mating end disposed in the interior chamber of the housing, the contact extending from the back end of the housing to the contact mounting surface, the housing and contact mounting surfaces configured to be mounted to the mounting side of the substrate.

10. The connector assembly of claim 9, wherein the front end of the housing is disposed at an angle with respect to the mounting side of the substrate.

11. The connector assembly of claim 9, wherein the back end of the housing includes a contact opening extending through the back end to the interior chamber and a contact slot extending from the contact opening to the side of the housing, further wherein the contact extends from the interior chamber, through the contact opening, and along the back end within the contact slot to the contact mounting surface disposed outside of the housing.

12. The connector assembly of claim 9, wherein the tab is received into the tab slot in a direction that is oriented perpendicular to the housing mounting surface and toward the back end of the housing, the tab including a bend between the protrusion and the housing mounting surface that orients the housing mounting surface approximately parallel to the mounting side of the substrate.

13. A connector assembly for mounting to a substrate having an opening extending between a mounting side and an opposite side, the connector assembly comprising:
   a housing extending between a front end and an opposite back end and including an interior chamber extending inward from the front end, the interior chamber configured to mate with a mating connector, the housing comprising protrusions extending from opposite sides of the housing;
   mounting tabs held in the protrusions of the housing and downwardly extending from the protrusions toward the front end of the housing, the mounting tabs including mounting surfaces;
   a contact extending between a mating end disposed within the interior chamber of the housing to a contact mounting surface disposed outside of the housing, the mating end configured to engage a contact of the mating connector, wherein the mounting surfaces of the tabs and the contact mounting surface are coupled to the mounting side of the substrate with the front end of the housing extending through the opening in the substrate and protruding from the opposite side of the substrate.

14. The connector assembly of claim 13, wherein the protrusions comprise tab slots, and the mounting tabs are received in the tab slots in directions oriented perpendicular to the mounting surfaces of the tabs.

15. The connector assembly of claim 13, wherein the mounting tabs comprise a bend disposed between the protrusions and the mounting surfaces.

16. The connector assembly of claim 13, wherein the housing includes a side that intersects the front end and the back end and a contact slot disposed in the back end and extending to the side of the housing, further wherein the contact extends through the contact slot to the side of the housing and along the side of the housing to the contact mounting surface.

17. The connector assembly of claim 13, wherein the housing includes a contact slot disposed in the back end of the housing, and the contact is at least partially disposed within the contact slot and flush with the back end of the housing.

18. The connector assembly of claim 13, wherein the housing includes an external side that intersects the front end and the back end, the side including an internal ledge, further wherein the contact includes a retention barb that secures the contact to the internal ledge of the housing.

19. The connector assembly of claim 13, wherein the front end of the housing is recessed within the opening in the substrate between the sides of the substrate when the housing is mounted to the substrate.

20. The connector assembly of claim 13, wherein the front end of the housing is oriented at an angle with respect to the opposite side of the substrate.

* * * * *